United States Patent
Stanley et al.

(10) Patent No.: US 7,286,068 B2
(45) Date of Patent: Oct. 23, 2007

(54) METHOD AND SYSTEM FOR DETECTING FAILURES IN AN ANALOG-TO-DIGITAL CONVERTER

(75) Inventors: Roger D. Stanley, Phoenix, AZ (US); Walter E. Lange, Phoenix, AZ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/323,236

(22) Filed: Dec. 30, 2005

(65) Prior Publication Data

US 2007/0152861 A1 Jul. 5, 2007

(51) Int. Cl.
*H03M 1/10* (2006.01)

(52) U.S. Cl. ........................ 341/120; 341/155

(58) Field of Classification Search ......... 341/115–170
See application file for complete search history.

(56) References Cited

U.S. PATENT DOCUMENTS

| | | | | |
|---|---|---|---|---|
| 5,146,202 | A * | 9/1992 | Kashihara | 340/438 |
| 6,396,426 | B1 * | 5/2002 | Balard et al. | 341/120 |
| 6,972,700 | B2 * | 12/2005 | Kanekawa et al. | 341/116 |
| 2004/0163017 | A1 * | 8/2004 | Koga et al. | 714/48 |

* cited by examiner

*Primary Examiner*—Lam T. Mai
(74) *Attorney, Agent, or Firm*—Munck Butrus, P.C.

(57) ABSTRACT

A method for detecting failures in an analog-to-digital converter includes monitoring a series of outputs from an analog-to-digital converter and detecting a failure in the analog-to-digital converter when a specified number of consecutive outputs comprise a same value.

21 Claims, 3 Drawing Sheets

METHOD AND SYSTEM FOR DETECTING FAILURES IN AN ANALOG-TO-DIGITAL CONVERTER

TECHNICAL FIELD

This disclosure relates generally to computing systems and more specifically to a method and system for detecting failures in an analog-to-digital converter.

BACKGROUND

Conventional high resolution analog-to-digital converters allow all possible data patterns, including all zeros or all ones, within the serial data stream. Because two likely failure scenarios include having the serial output stuck high or stuck low, determining whether such an analog-to-digital converter has failed is difficult.

SUMMARY

This disclosure provides a method and system for detecting failures in an analog-to-digital converter.

In a first embodiment, a method includes monitoring a series of outputs from an analog-to-digital converter and detecting a failure in the analog-to-digital converter when a specified number of consecutive outputs comprise a same value.

In particular embodiments, monitoring the series of outputs includes incrementing a same output counter when an output comprises a same value as an immediately previously received output.

In other particular embodiments, detecting a failure in the analog-to-digital converter when a specified number of consecutive outputs comprise a same value includes detecting a failure when the same output counter surpasses a failure threshold.

In a second embodiment, a system includes a same output counter and a detector controller. The same output counter is operable to store a count of a consecutive number of outputs comprising a same value received from an analog-to-digital converter. The detector controller is operable to detect a failure in the analog-to-digital converter based on the count stored in the same output counter.

In a third embodiment, a computer program is embodied on a computer readable medium and is operable to be executed by a processor. The computer program includes computer readable program code for monitoring a series of outputs from an analog-to-digital converter and for detecting a failure in the analog-to-digital converter when a specified number of consecutive outputs comprise a same value.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

Figure 1:
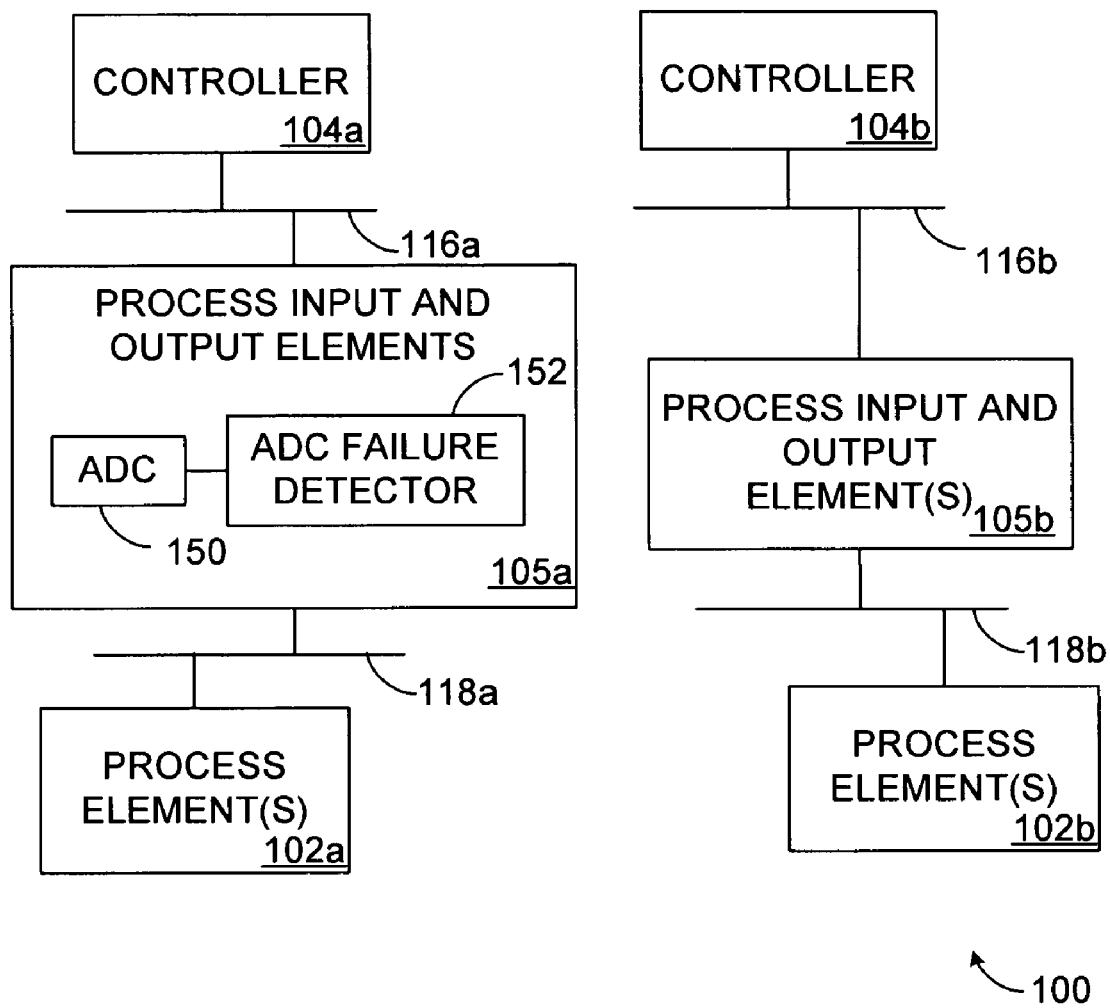
FIG. 1 illustrates an example process control system according to one embodiment of this disclosure.

FIG. 1 illustrates an example process control system 100 according to one embodiment of this disclosure. The embodiment of the process control system 100 shown in FIG. 1 is for illustration only. Other embodiments of the process control system 100 may be used without departing from the scope of this disclosure.

In this example embodiment, the process control system 100 includes one or more process elements 102a-102b. The process elements 102a-102b represent components in a process or production system that may perform any of a wide variety of functions. For example, the process elements 102a-102b could represent motors, catalytic crackers, valves, and other industrial equipment in a production environment. The process elements 102a-102b could represent any other or additional components in any suitable process or production system. Each of the process elements 102a-102b includes any hardware, software, firmware, or combination thereof for performing one or more functions in a process or production system.

Two controllers 104a-104b are coupled to process input and output elements 105a-105b, which are in turn coupled to the process elements 102a-102b. The controllers 104a-104b control the operation of the process elements 102a-102b through the process input and output elements 105a-105b. For example, the controllers 104a-104b provide control signals conditioned by the process input and output elements 105a-105b that are coupled to the process elements 102a-102b periodically. As a particular example, if a process element 102a-102b represents a motor, one of the controllers 104a-104b could provide control information through a process output element 105a-105b to the motor once every millisecond. Each of the controllers 104a-104b along with the process input and output elements 105a-105b include any hardware, software, firmware, or combination thereof for controlling one or more of the process elements 102a-102b. The controllers 104a-104b could, for example, include processors of the POWERPC processor family running the GREEN HILLS INTEGRITY operating system or processors of the X86 processor family running a MICROSOFT WINDOWS operating system.

As shown in FIG. 1, the system 100 includes various networks 116a-116b and 118a-118b that support communication between components in the system 100. Each of these networks 116a-116b, 118a-118b represents any suitable network or combination of networks facilitating communication between components in the system 100. The networks 116a-116b, 118a-118b could, for example, represent Ethernet networks.

For some embodiments, one or more process input and output elements, such as the process input and output elements 105a, or other suitable components of the system 100 may comprise an analog-to-digital converter (ADC) 150 and an ADC failure detector 152 coupled to the ADC 150. As described in more detail below in connection with FIGS. 2 and 3, the ADC failure detector 152 is operable to monitor a series of outputs from the ADC 150 and to detect a failure in the ADC 150 when a specified number of consecutive outputs from the ADC 150 comprise a same value.

Although FIG. 1 illustrates one example of a process control system 100, various changes may be made to FIG. 1.

For example, a control system could include any number of process elements, controllers, process input and output elements, and the like. Also, FIG. 1 illustrates one operational environment in which an ADC failure detector 152 could be used. The ADC failure detector 152 could be used in any other suitable device or system comprising an analog-to-digital converter 150.

Figure 2:
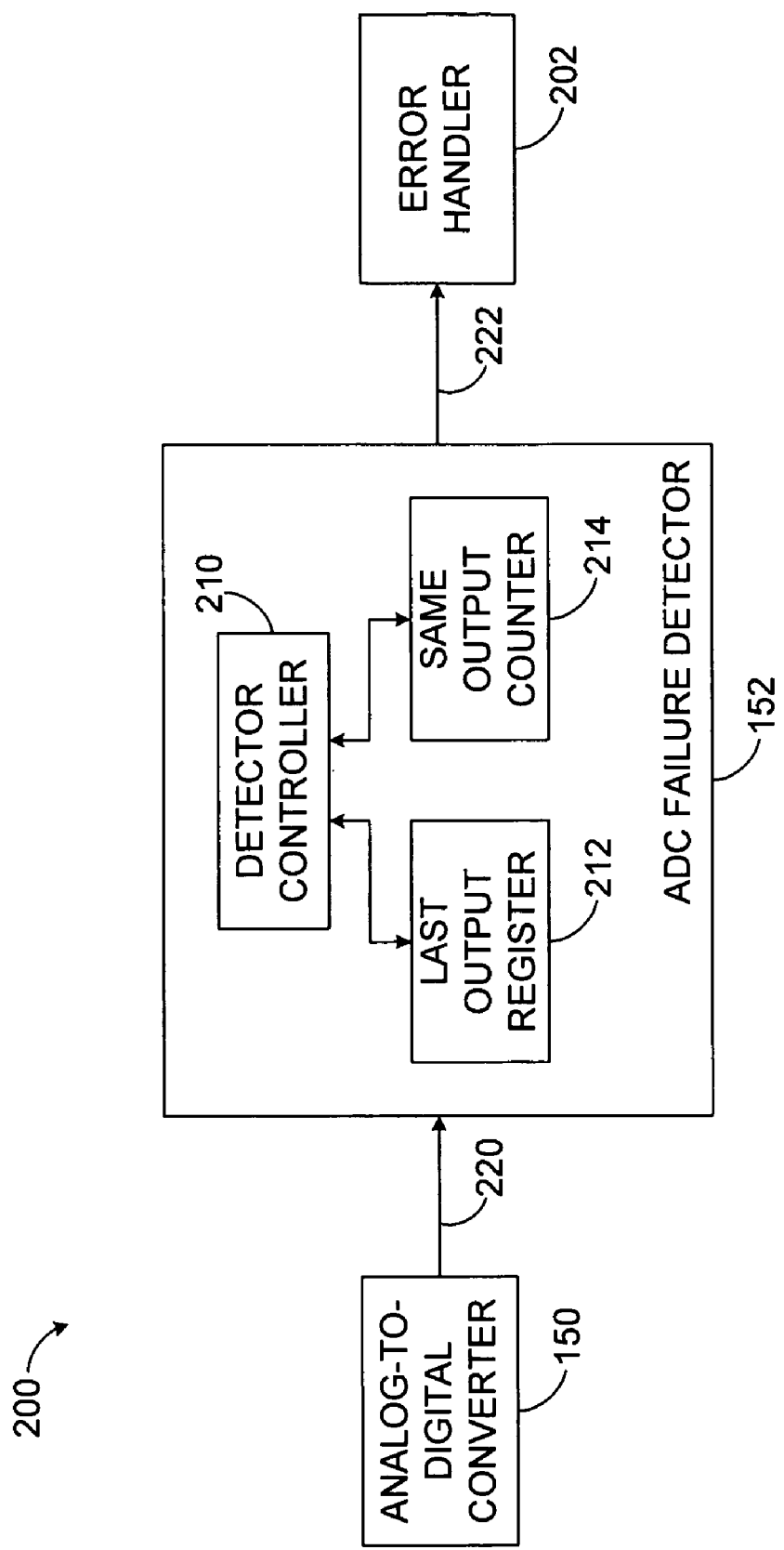
FIG. 2 illustrates an example system for detecting failures in the analog-to-digital converter of FIG. 1 according to one embodiment of this disclosure.

FIG. 2 illustrates an example system 200 for detecting failures in the analog-to-digital converter 150 according to one embodiment of this disclosure. The embodiment of the system 200 shown in FIG. 2 is for illustration only. Other embodiments of the system could be used without departing from the scope of this disclosure. Although the system 200 may be implemented in the process input and output elements 105a of FIG. 1 as described above, it will be understood that the system 200 may be used in any other suitable device or system comprising an ADC 150.

The ADC 150 may comprise a high resolution analog-to-digital converter in which the low order bits are below a noise threshold such that these low order bits randomly change from one conversion to the next. The ADC 150 may also comprise any physical sensor-to-digital converter, such as a strain gauge, thermocouple, voltage, temperature sensor or the like, that has a high enough resolution to reach the noise floor of the sensor. The ADC 150 may also comprise any non-repeating data system, such as a time-tagged data system.

In this example embodiment, the system 200 may comprise an error handler 202, in addition to the analog-to-digital converter 150 and the ADC failure detector 152. The error handler 202 is coupled to the ADC failure detector 152 and is operable to handle errors for the environment in which the system 200 is implemented. For example, if the system 200 is implemented in the process input and output elements 105a of FIG. 1, the error handler 202 may be operable to handle a variety of errors for the process input and output elements 105a, including errors related to the ADC 150.

The ADC failure detector 152, which is coupled to the ADC 150, comprises a detector controller 210, a last output register 212 and a same output counter 214. The ADC 150 is operable to convert a series of analog inputs into a corresponding series of digital outputs. The ADC 150 is also operable to provide a series of outputs 220 to the ADC failure detector 152.

For some embodiments, the outputs 220 provided to the ADC failure detector 152 may comprise the digital outputs generated by the ADC 150. However, it will be understood that the outputs 220 may also comprise partial outputs that include only a particular portion of the digital outputs. For example, the outputs 220 may comprise a specified number of least significant bits or other suitable portion of the digital outputs.

The detector controller 210 is operable to monitor the outputs 220 received from the ADC 150 and to detect a failure in the ADC 150 when a specified number of consecutive outputs 220 comprise a same value. For a particular embodiment, the detector controller 210 is operable to accomplish this by storing outputs 220 in the last output register 212 and keeping track of the number of consecutive outputs 220 that are the same value in the same output counter 214.

The last output register 212 may comprise any suitable data store that is operable to store the outputs 220 or a portion of the outputs 220 received at the ADC failure detector 152 from the ADC 150. The last output register 212 is operable to store each output 220 in succession such that the detector controller 210 may compare a subsequently received output 220 to the immediately previously received output as stored in the last output register 212.

The detector controller 210 may be operable to store the outputs 220 as received from the ADC 150 in the last output register 212. However, for some embodiments, the detector controller 210 may be operable to store a specified portion of the outputs 220 in the last output register 212. For example, if the outputs 220 comprise the full digital outputs generated by the ADC 150, the detector controller 210 may store only a specified number of least significant bits or other suitable portion of the outputs 220 in the last output register 212.

The same output counter 214 may comprise any suitable data store that is operable to store a value corresponding to the number of consecutive outputs 220 or portions of outputs 220 that are the same value. For some embodiments, the same output counter 214 may store a value equal to the number of same consecutive outputs 220; however, it will be understood that the same output counter 214 may store any other suitable value operable to identify the number of same consecutive outputs 220 without departing from the scope of the present disclosure.

The detector controller 210 is also operable to generate an ADC failure signal 222 when the detector controller 210 determines that a failure has occurred in the ADC 150 based on the value stored in the same output counter 214 surpassing a predetermined failure threshold. For example, for an embodiment in which the ADC 150 comprises a 24-bit analog-to-digital voltage converter that has only 18 bits of resolution, the lower six bits of the digital outputs generated by the ADC 150 are affected by thermal noise such that these bits randomly change from one conversion to the next. For this example, the odds of the lower six bits comprising a same value for six consecutive conversions is 1.455e-11. Thus, in this example, the failure threshold may be set at six without much risk of a false failure detection.

For some embodiments, the detector controller 210 may also be operable to generate an ADC okay signal when the detector controller 210 has not determined that a failure has occurred in the ADC 150. The detector controller 210 is also operable to provide the ADC failure signal 222 and, if used, the ADC okay signal to the error handler 202.

The error handler 202 is operable to respond to the ADC failure signal 222 in any suitable manner. For example, the error handler 202 may be operable to reset or re-initialize the ADC 150, to notify an operator of the system 200 that the ADC 150 has failed, or to perform any other suitable operation in response to the failure.

Figure 3:
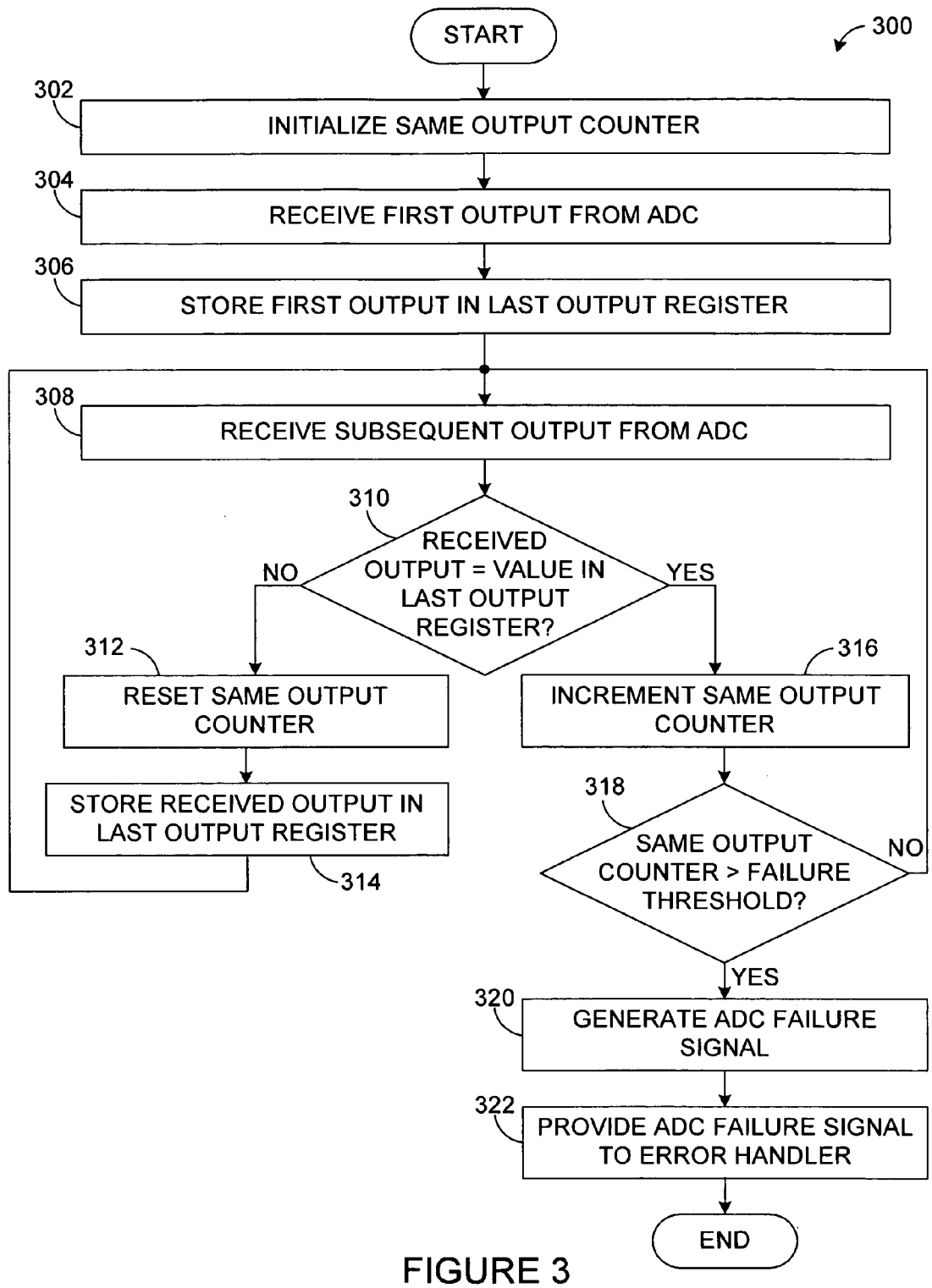
FIG. 3 illustrates an example method for detecting failures in the analog-to-digital converter of FIG. 2 using the failure detector of FIG. 2 according to one embodiment of this disclosure.

FIG. 3 illustrates an example method 300 for detecting failures in the analog-to-digital converter 150 using the failure detector 152 according to one embodiment of this disclosure. As with the system 200 of FIG. 2, the method 300 may be performed in the process input and output elements 105a of FIG. 1 or in any other suitable device or system comprising an ADC 150.

The detector controller 210 initializes the same output counter 214 at step 302. For example, the detector controller 210 may set the value stored in the same output counter 214 to zero or other suitable initial value. The detector controller 210 receives a first output 220 from the ADC 150 at step 304 and stores at least a portion of the first output 220 in the last output register 212 at step 306.

The detector controller 210 receives a subsequent output 220 from the ADC 150 at step 308. At this point, the detector controller 210 determines if the subsequently received output 220 (or a portion of the output 220) is the same as the value stored in the last output register 212 at step 310.

If the subsequently received output 220 is not the same as the value stored in the last output register 212, the detector controller 210 may reset the same output counter 214 at optional step 312. For example, the detector controller 210 may reset the same output counter 214 to a value of zero or other suitable initial value. However, in an alternative embodiment, the detector controller 210 may determine whether the value stored in the same output counter 214 has changed after being initialized or reset. In this embodiment, the detector controller 210 may reset the same output counter 214 only when the value has changed.

The detector controller 210 then stores at least a portion of the subsequently received output 220 in the last output register 212 in place of the previously received output 220 at step 314, after which the detector controller 210 receives yet another output 220 from the ADC 150 at step 308 and the method continues as before.

Returning to step 310, if the subsequently received output 220 is the same as the value stored in the last output register 212, the detector controller 210 increments the same output counter 214 at step 316. At this point, the detector controller 210 determines whether the value stored in the same output counter 214 is greater than a predetermined failure threshold at step 318.

If the value stored in the same output counter 214 is not greater than the predetermined failure threshold, the detector controller 210 receives yet another output 220 from the ADC 150 at step 308 and the method continues as before. However, if the value stored in the same output counter 214 is greater than the predetermined failure threshold, the detector controller 210 generates an ADC failure signal 222 at step 320 and provides the ADC failure signal 222 to the error handler 202, which may respond in any suitable manner, at step 322.

In some embodiments, the various functions performed within or in conjunction with the ADC failure detector 152 are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory.

It may be advantageous to set forth definitions of certain words and phrases used throughout this patent document. The term "couple" and its derivatives refer to any direct or indirect communication between two or more elements, whether or not those elements are in physical contact with one another. The term "application" refers to one or more computer programs, sets of instructions, procedures, functions, objects, classes, instances, or related data adapted for implementation in a suitable computer language. The terms "include" and "comprise," as well as derivatives thereof, mean inclusion without limitation. The term "or" is inclusive, meaning and/or. The term "each" means every one of at least a subset of the identified items. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation. A controller may be implemented in hardware, firmware, software, or some combination of at least two of the same. The functionality associated with any particular controller may be centralized or distributed, whether locally or remotely.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method, comprising:
monitoring a series of outputs from an analog-to-digital converter; and
detecting a failure in the analog-to-digital converter when a specified number of consecutive outputs comprise a same value.

2. The method of claim 1, wherein monitoring the series of outputs comprising storing, in succession, each output that is different from an immediately previously received output.

3. The method of claim 1, wherein monitoring the series of outputs comprising incrementing a same output counter when an output comprises a same value as an immediately previously received output.

4. The method of claim 3, wherein detecting a failure in the analog-to-digital converter when a specified number of consecutive outputs comprise a same value comprising detecting a failure when the same output counter surpasses a failure threshold.

5. The method of claim 3, wherein monitoring the series of outputs further comprising resetting the same output counter when an output comprises a different value from an immediately previously received output.

6. The method of claim 1, further comprising generating a failure signal when the failure in the analog-to-digital converter is detected.

7. The method of claim 6, further comprising providing the failure signal to an error handler.

8. The method of claim 1, wherein monitoring the series of outputs from the analog-to-digital converter comprises monitoring only a specified number of least significant bits of the outputs from the analog-to-digital converter.

9. An apparatus, comprising:
a same output counter operable to store a count of a consecutive number of outputs comprising a same value received from an analog-to-digital converter; and
a detector controller operable to detect a failure in the analog-to-digital converter based on the count stored in the same output counter.

10. The apparatus of claim 9, further comprising a last output register, the detector controller further operable to store, in succession, each output that is different from an immediately previously received output in the last output register.

11. The apparatus of claim 9, wherein the detector controller further operable to increment the same output counter when an output comprises a same value as an immediately previously received output.

12. The apparatus of claim 11, wherein the detector controller further operable to reset the same output counter when an output comprises a different value from an immediately previously received output.

13. The apparatus of claim 9, wherein the detector controller further operable to generate a failure signal when the failure in the analog-to-digital converter is detected.

14. The apparatus of claim 13, wherein the detector controller further operable to provide the failure signal to an error handler.

15. A computer program embodied on a computer readable medium and operable to be executed by a processor, the computer program comprising computer readable program code for:
   monitoring a series of outputs from an analog-to-digital converter; and
   detecting a failure in the analog-to-digital converter when a specified number of consecutive outputs comprise a same value.

16. The computer program of claim 15, wherein the computer readable program code for monitoring the outputs comprises computer readable program code for storing, in succession, each output that is different from an immediately previously received output.

17. The computer program of claim 15, wherein the computer readable program code for monitoring the outputs comprises computer readable program code for incrementing a same output counter when an output comprises a same value as an immediately previously received output.

18. The computer program of claim 17, wherein the computer readable program code for detecting a failure in the analog-to-digital converter when a specified number of consecutive outputs comprise a same value comprises computer readable program code for detecting a failure when the same output counter surpasses a failure threshold.

19. The computer program of claim 17, wherein the computer readable program code for monitoring the outputs further comprises computer readable program code for resetting the same output counter when an output comprises a different value from an immediately previously received output.

20. The computer program of claim 15, further comprising computer readable program code for generating a failure signal when the failure in the analog-to-digital converter is detected.

21. The computer program of claim 20, further comprising computer readable program code for providing the failure signal to an error handler.

* * * * *